(12) United States Patent
Kuroda

(10) Patent No.: US 11,164,718 B2
(45) Date of Patent: Nov. 2, 2021

(54) ELECTRON BEAM DETECTION ELEMENT, ELECTRON MICROSCOPE, AND TRANSMISSION ELECTRON MICROSCOPE

(71) Applicant: CANON KABUSHIKI KAISHA, Tokyo (JP)

(72) Inventor: Yukihiro Kuroda, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/179,783

(22) Filed: Nov. 2, 2018

(65) Prior Publication Data

US 2019/0139737 A1    May 9, 2019

(30) Foreign Application Priority Data

Nov. 7, 2017    (JP) .............................. JP2017-214833

(51) Int. Cl.
| | | |
|---|---|---|
| H01J 37/00 | (2006.01) | |
| H01J 37/244 | (2006.01) | |
| H01J 37/28 | (2006.01) | |
| H01J 37/26 | (2006.01) | |

(52) U.S. Cl.
CPC ............ *H01J 37/244* (2013.01); *H01J 37/26* (2013.01); *H01J 37/28* (2013.01); *H01J 2237/2441* (2013.01); *H01J 2237/2446* (2013.01); *H01J 2237/2801* (2013.01)

(58) Field of Classification Search
CPC .......... H01J 37/244; H01J 37/26; H01J 37/28; H01J 2237/2441; H01J 2237/2446; H01J 2237/2801

USPC ................ 250/306, 307, 310, 311
See application file for complete search history.

(56) References Cited

U.S. PATENT DOCUMENTS

| | | | | |
|---|---|---|---|---|
| 5,717,204 | A * | 2/1998 | Meisburger | H01J 37/28 |
| | | | | 250/306 |
| 5,811,805 | A * | 9/1998 | Osakabe | H01J 37/244 |
| | | | | 250/311 |
| 9,513,382 | B2 | 12/2016 | Nishihara | |
| 2005/0206761 | A1 | 9/2005 | Iguchi | |
| 2013/0015331 | A1* | 1/2013 | Birk | G01J 1/44 |
| | | | | 250/208.2 |
| 2014/0333812 | A1* | 11/2014 | Kuroda | H04N 5/343 |
| | | | | 348/302 |
| 2014/0347505 | A1* | 11/2014 | Suzuki | H04N 5/361 |
| | | | | 348/208.1 |
| 2016/0071687 | A1* | 3/2016 | Tsuchiya | H01J 37/20 |
| | | | | 250/307 |

(Continued)

FOREIGN PATENT DOCUMENTS

| | | |
|---|---|---|
| CN | 102036023 A | 4/2011 |
| CN | 102879088 A | 1/2013 |
| JP | 9-63530 A | 3/1997 |

(Continued)

*Primary Examiner* — Michael Maskell
(74) *Attorney, Agent, or Firm* — Canon U.S.A., Inc. IP Division

(57) ABSTRACT

An electron beam detection element according to an exemplary embodiment includes a plurality of unit cells. Each of the plurality of unit cells includes a diode of avalanche multiplication type and a plurality of memories. The diode of avalanche multiplication type is configured to detect an electron beam. The plurality of memories store signals of different frames respectively, each of the signals being output from the diode.

21 Claims, 11 Drawing Sheets

(56) References Cited

U.S. PATENT DOCUMENTS

2017/0301816 A1* 10/2017 Moore .................. H01L 31/107

FOREIGN PATENT DOCUMENTS

| | | |
|---|---|---|
| JP | 2004-193675 A1 | 7/2004 |
| JP | 2013-20972 A | 1/2013 |
| WO | 2017109843 A1 | 6/2017 |

* cited by examiner

FIG.7

| D31[0] | D32[0] | D33[0] |
|---|---|---|
| D21[0] | D22[0] | D23[0] |
| D11[0] | D12[0] | D13[0] |

FIRST FRAME
IMAGE DATA

| D31[1] | D32[1] | D33[1] |
|---|---|---|
| D21[1] | D22[1] | D23[1] |
| D11[1] | D12[1] | D13[1] |

SECOND FRAME
IMAGE DATA

| D31[2] | D32[2] | D33[2] |
|---|---|---|
| D21[2] | D22[2] | D23[2] |
| D11[2] | D12[2] | D13[2] |

THIRD FRAME
IMAGE DATA

ELECTRON BEAM DETECTION ELEMENT, ELECTRON MICROSCOPE, AND TRANSMISSION ELECTRON MICROSCOPE

BACKGROUND

Field of the Disclosure

The present disclosure relates to an electron beam detection element, an electron microscope, and a transmission electron microscope.

Description of the Related Art

A microscope that irradiates a subject with an electron beam emitted from an electron gun and includes an electron beam detection element for detecting electrons transmitted through the subject or secondary electrons emitted from the subject has been known.

Among examples of such an electron beam detection elements is a light detection apparatus discussed in Japanese Patent Application Laid-Open No. 2013-20972. Japanese Patent Application Laid-Open No. 2013-20972 discusses activating diodes located in the irradiation range of the electron beam and deactivating diodes located in other ranges.

SUMMARY

According to an aspect of the present disclosure, an electron beam detection element includes a plurality of unit cells. Each of the plurality of unit cells includes a diode of avalanche multiplication type and a plurality of memories. The diode is configured to receive an electron beam. The plurality of memories are configured to store signals of different frames respectively, each of the signals being output from the diode.

Further features of the present disclosure will become apparent from the following description of exemplary embodiments with reference to the attached drawings.

BRIEF DESCRIPTION OF THE DRAWINGS

FIG. 7 is a diagram schematically illustrating image data output from a signal processing apparatus.

DESCRIPTION OF THE EMBODIMENTS

According to several exemplary embodiments of the present disclosure, imaging can be performed at a high speed. An electron beam detection element may sometimes perform imaging of a plurality of frames at a high speed. Since Japanese Patent Application Laid-Open No. 2013-20972 is not seen to discuss a detailed configuration of the electron beam detection element, high speed imaging according to its technique is difficult.

Figure 1A:
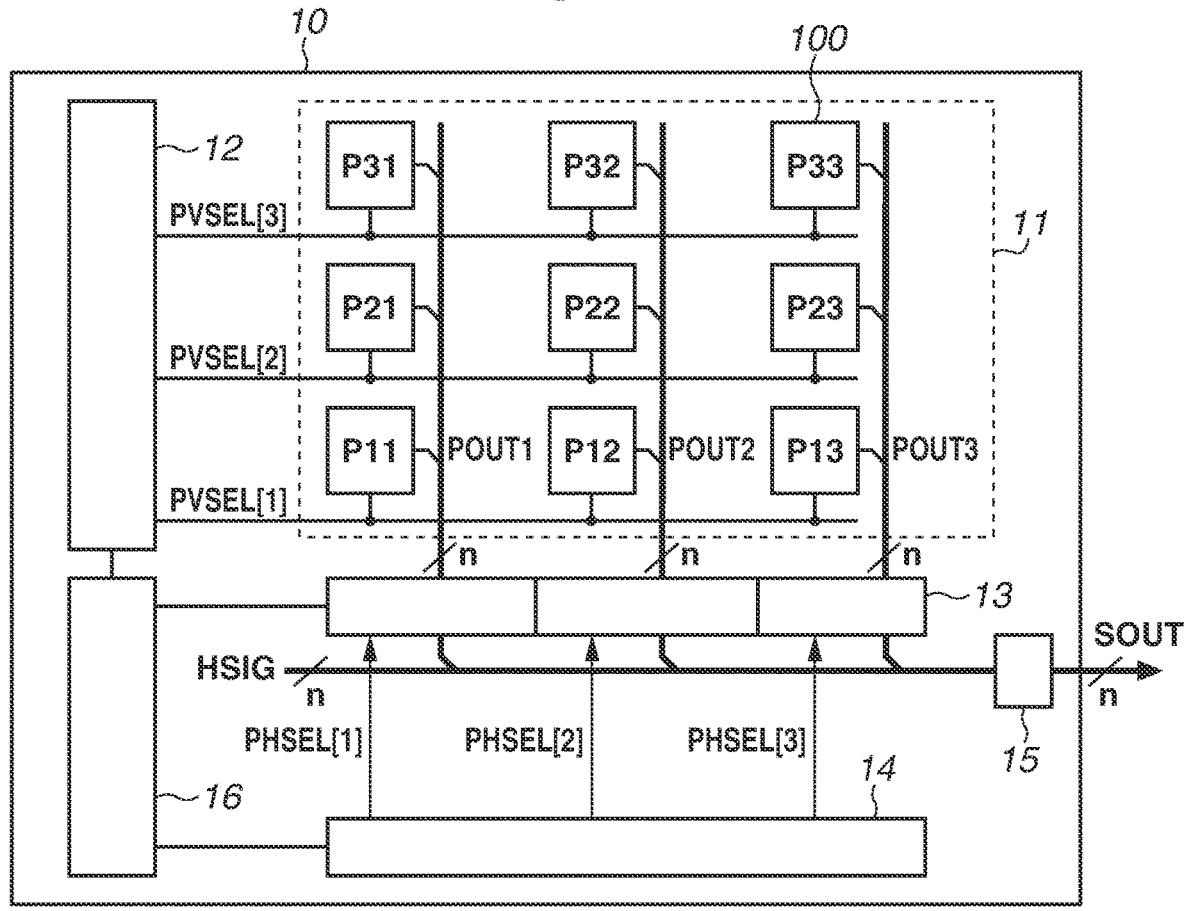
FIG. 1A is a diagram schematically illustrating a configuration of an electron beam detection element.

An electron beam detection element according to a first exemplary embodiment will be described. FIG. 1A is a diagram schematically illustrating a configuration of the electron beam detection element. An electron beam detection element 10 includes a plurality of unit cells 100. Each of the unit cells 100 outputs a signal according to incidence of an electron beam. The plurality of unit cells 100 is arranged in a matrix form in an electron beam detection area 11.

The electron beam detection element 10 includes a vertical scanning circuit 12, signal processing circuits 13 and a horizontal scanning circuit 14. The vertical scanning circuit 12 drives the unit cells 100. The signal processing circuits 13 process the signals output from the unit cells 100. The horizontal scanning circuit 14 is for reading signals from the signal processing circuits 13. The electron beam detection element 10 further includes an output circuit 15 which outputs the signals to outside, and a control circuit 16 which controls operation of the circuits 12 to 15.

A plurality of signal processing circuits 13 is provided in the electron beam detection element 10, and each of the signal processing circuits 13 corresponds to a different column formed by the plurality of unit cells 100. Each of the signal processing circuits 13 has a function of storing signals output from the unit cells 100. Unit cells 100 in a single column are connected with a plurality of output signal lines (in FIG. 1B, n output signal lines). The signal processing circuit 13 corresponding to each column can thus store a plurality of signals output from the unit cells 100 in the corresponding column.

Figure 2:
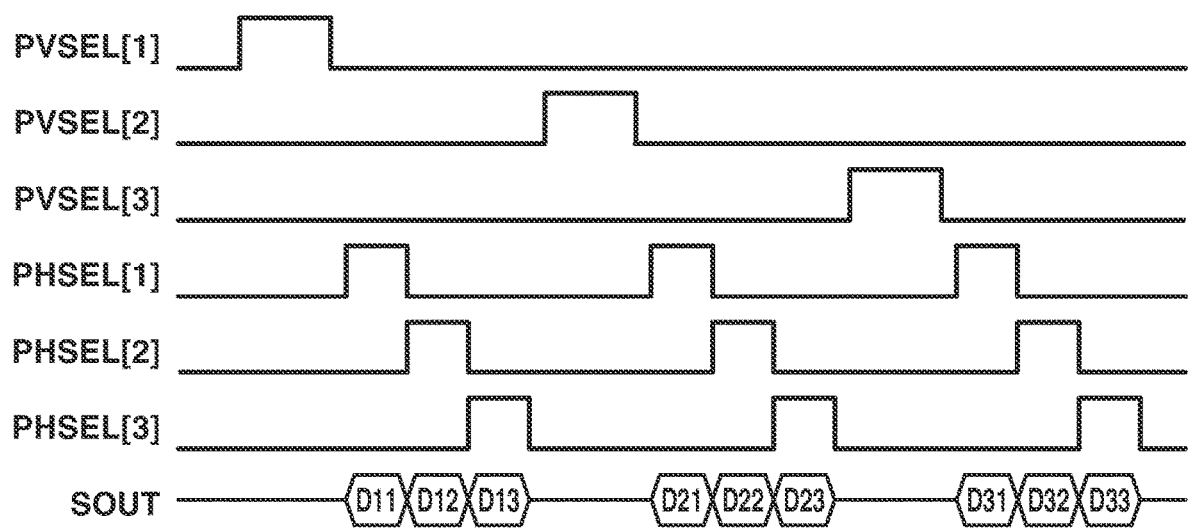
FIG. 2 is a timing chart illustrating an operation of the electron beam detection element.

An operation of the electron beam detection element 10 will be described. FIG. 2 is a diagram schematically illustrating a timing chart of control signals and output signals for the electron beam detection element 10. A plurality of unit cells 100 outputs signals row by row based on control signals PVSEL[1] to PVSEL[3] supplied from the vertical scanning circuit 12. In a period when a control signal PVSEL[k] is at a high level, the unit cells 100 in the corresponding kth row output signals. The plurality of signal processing circuits 13 simultaneously store the signals of a plurality of unit cells 100 included in a row. The signals stored in the plurality of signal processing circuits 13 are read based on control signals PHSEL[1] to PHSEL[3] supplied from the horizontal scanning circuit 14. In a period when a control signal PHSEL[k] is at a high level, a signal is read from the signal processing circuit 13 at the corresponding kth column.

In FIG. 1A, the unit cells 100 are designated by the reference symbols P11 to P33 for the sake of distinction. Pieces of data D11 to D33 of an output signal SOUT represent the signals output from the unit cells 100 having the respective corresponding reference symbols. For example, the unit cell 100 designated by the reference symbol P11 outputs data D11. In the present exemplary embodiment, each of the unit cells 100 collectively outputs signals corresponding to a plurality of frames. In other words, the data D11 includes information about a plurality of frames.

Figure 1B:
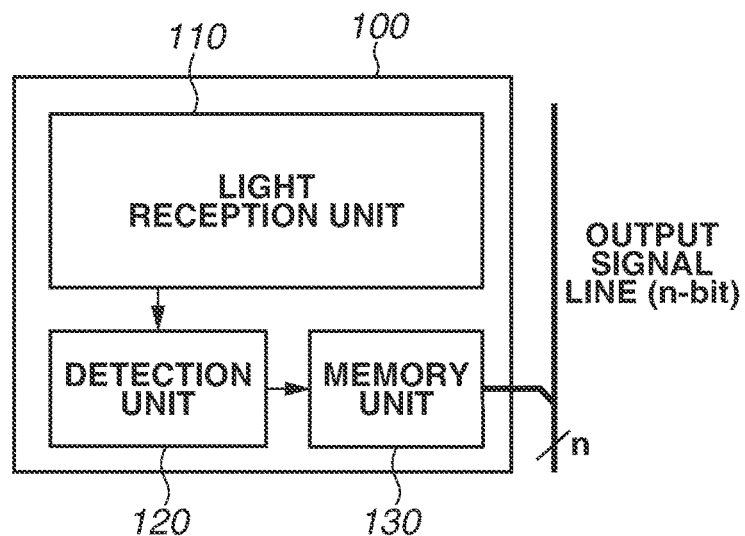
FIG. 1B is a diagram schematically illustrating a configuration of a unit cell of the electron beam detection element.

A configuration of the unit cells 100 for outputting information about a plurality of frames will be described. FIG. 1B is a diagram schematically illustrating the configuration of the unit cell 100. The unit cell 100 includes a light reception unit 110, a detection unit 120, and a memory unit 130. The light reception unit 110 receives an electron beam. The detection unit 120 detects the incidence of the electron beam on the light reception unit 110. The memory unit 130 stores a signal from the light reception unit 110.

The light reception unit 110 is a diode of avalanche multiplication type. An electron avalanche phenomenon occurs at incidence of an electron beam, whereby a plurality of electrons (and electron holes) is released. The detection unit 120 detects incidence of the electron beam by detecting a change in the potential of the light reception unit 110 due to the electron avalanche phenomenon. The memory unit 130 includes a plurality of memories. Each memory stores an output signal from the detection unit 120. The plurality of memories stores information about incidence of an electron beam on the light reception unit 110 in periods different from each other (different electron beam irradiation period). With such a configuration, each of the unit cells 100 can store information about a plurality of frames.

Each of the unit cells 100 is connected with a plurality of output signal lines. The plurality of output signal lines is connected to the plurality of memories, respectively. In FIGS. 1A and 1B, n output signal lines are illustrated as a single piece of bus wiring for the sake of simplicity. With such a configuration, information about a plurality of frames can be output to a signal processing circuit 13 in parallel.

As descried above, the electron beam detection element 10 includes the unit cells 100 each including a plurality of memories. According to such a configuration, each of the unit cells 100 can store information about a plurality of frames. The electron beam detection element 10 can thus perform imaging of a plurality of frames without intervention during a period for reading signals. As a result, the imaging of a plurality of frames can be performed at a high speed.

Figure 3:
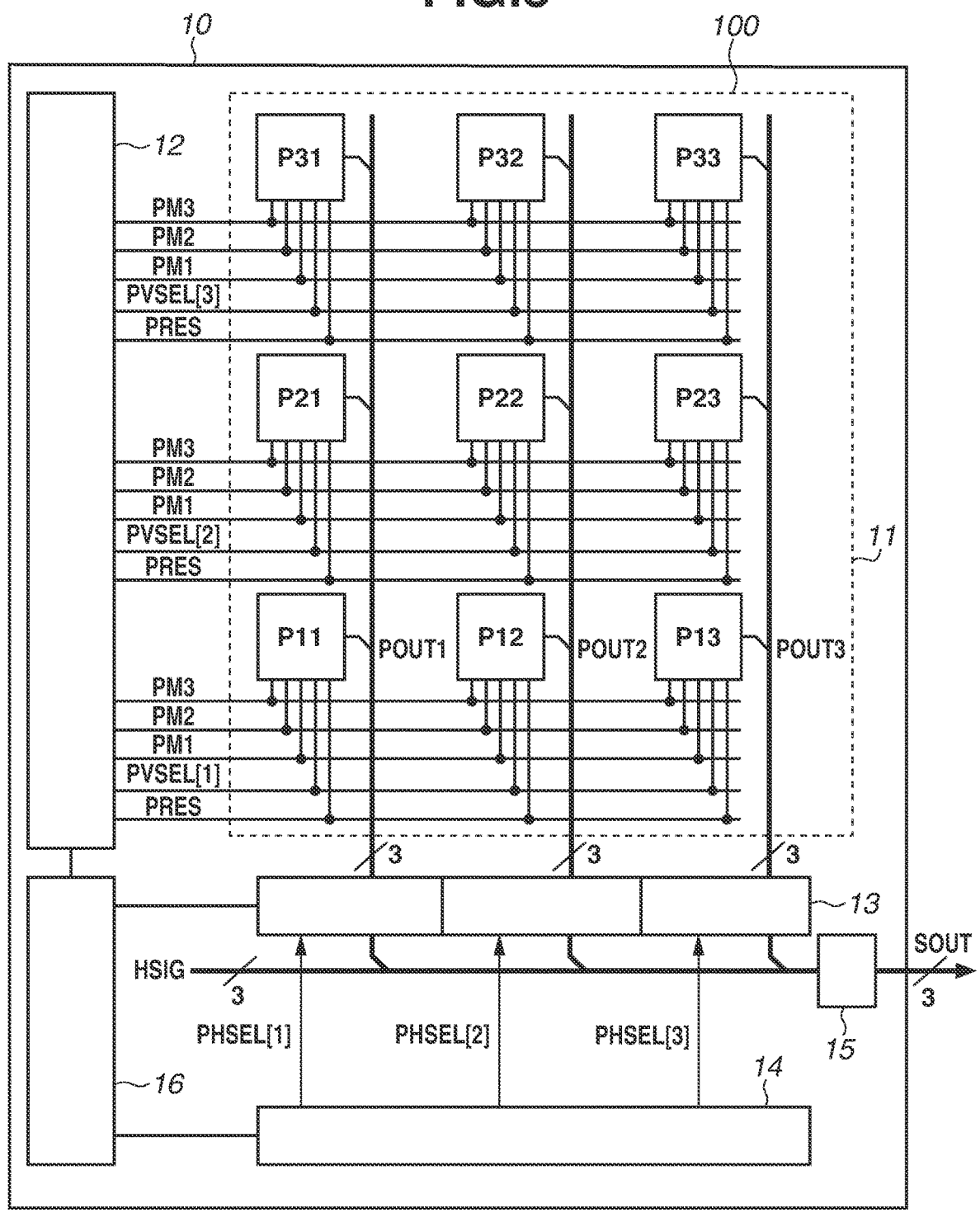
FIG. 3 is a diagram schematically illustrating a configuration of an electron beam detection element.

An electron beam detection element according to a second exemplary embodiment will be described. The present exemplary embodiment is different from the first exemplary embodiment in that the unit cell 100 includes a selection unit for selecting a memory where a signal is stored. FIG. 3 is a diagram schematically illustrating a configuration of the electron beam detection element. Portions having functions similar to those of FIGS. 1A and 1B are designated by the same reference numerals or symbols as in FIGS. 1A and 1B.

An electron beam detection element 10 includes a plurality of unit cells 100. Each of the unit cells 100 outputs signals according to incidence of an electron beam. The plurality of unit cells 100 is arranged in a matrix form in an electron beam detection area 11.

The electron beam detection element 10 includes a vertical scanning circuit 12, signal processing circuits 13, and a horizontal scanning circuit 14. The vertical scanning circuit 12 drives the unit cells 100. The signal processing circuits 13 process the signals output from the unit cells 100. The horizontal scanning circuit 14 is intended to read signals from the signal processing circuits 13. The electron beam detection element 10 further includes an output circuit 15 which outputs the signals to outside and includes a control circuit 16 which controls operation of the circuits 12 to 15.

A plurality of signal processing circuits 13 is provided in the electron beam detection element 10, and each of the signal processing circuits 13 corresponds to a different column formed by the plurality of unit cells 100. Each of the signal processing circuits 13 has a function of storing signals output from the unit cells 100. Unit cells 100 in a single column are connected with a plurality of output signal lines (in FIG. 3, three output signal lines). Each of the signal processing circuits 13 corresponding to a different column can thus store a plurality of signals output from the unit cell 100 in the corresponding column.

Figure 4:
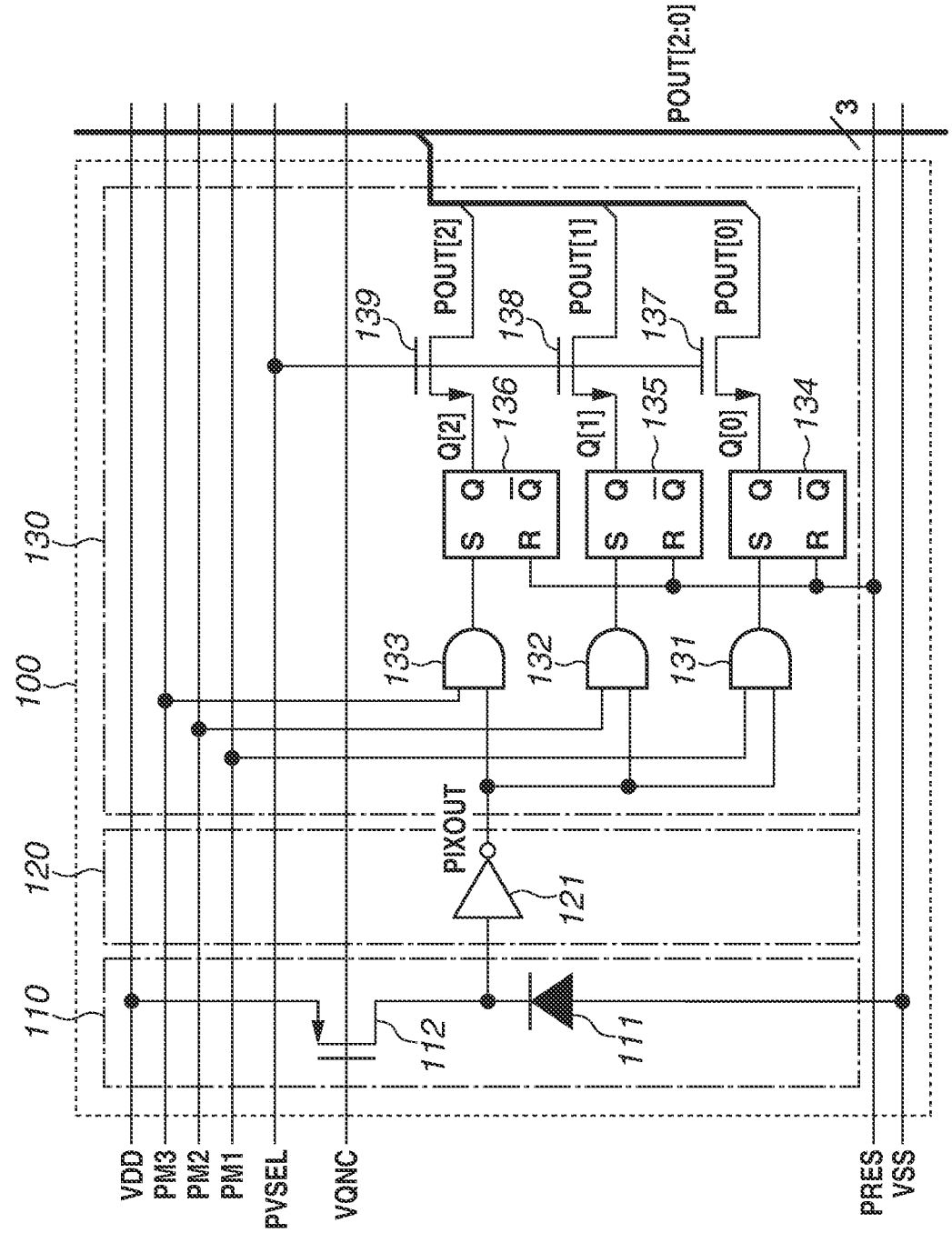
FIG. 4 is a diagram schematically illustrating a configuration of a unit cell of the electron beam detection element.

Next, a configuration of the unit cell 100 will be described. FIG. 4 is an equivalent circuit diagram schematically illustrating the configuration of the unit cell 100. The unit cell 100 includes a light reception unit 110, a detection unit 120, and a memory unit 130. The light reception unit 110 receives an electron beam. The detection unit 120 detects incidence of an electron beam on the light reception unit 110. The memory unit 130 stores a signal from the light reception unit 110.

The light reception unit 110 includes a diode 111 of avalanche multiplication type and a quenching element 112. A reverse bias having a magnitude greater than or equal to a breakdown voltage is applied the diode 111, whereby the diode 111 is set to operate in a Geiger mode. In the example of FIG. 4, the quenching element 112 is a quenching resistor formed by a metal-oxide-semiconductor (MOS) transistor to which a voltage VQNC is supplied. If an electron beam is incident on the diode 111, a plurality of electrons (and electron holes) is released because of an electron avalanche phenomenon. An electric current created by the electron avalanche phenomenon passes through the quenching element 112 so that voltage is dropped, which causes the operation range of the diode 111 to fall outside the range of the Geiger mode. This stops the electron avalanche phenomenon of the diode 111 and eliminates the voltage drop by the quenching element 112, so that the operation range of the diode 111 enters the range of the Geiger mode again.

The detection unit 120 includes an inverter circuit 121. The inverter circuit 121 inverts and amplifies a change in the potential of the cathode of the diode 111. With such a configuration, the detection unit 120 can detect incidence of an electron beam on the light reception unit 110 with high sensitivity.

The memory unit 130 includes a plurality of memories 134 to 136. Each memory stores an output signal of the detection unit 120. In the present exemplary embodiment, each memory includes a set-reset (SR) latch circuit. Each of the plurality of memories 134 to 136 thus stores one bit of information. A signal from the detection unit 120 is input to the input node S of each SR latch circuit. A control signal PRES is input to the input node R.

The memory unit 130 further includes selection units 131 to 133. The selection unit 131 receives a control signal PM1 and the output signal of the detection unit 120. The selection unit 131 outputs the output signal of the detection unit 120 to the memory 134 in a period when the control signal PM1 is at a high level.

Similarly, the selection unit 132 receives a control signal PM2 and the output signal of the detection unit 120. The selection unit 132 outputs the output signal of the detection unit 120 to the memory 135 in a period when the control signal PM2 is at a high level. The selection unit 133 receives a control signal PM3 and the output signal of the detection unit 120. The selection unit 133 outputs the output signal of the detection unit 120 to the memory 134 in a period when the control signal PM3 is at a high level.

The selection units 131 to 133 have a function of selecting the memory to store a signal based on the control signals PM1 to PM3. Each of the selection units 131 to 133 selects a different memory in different periods (different electron beam irradiation periods). In response to the selection, the plurality of memories 134 to 136 store information about incidence of the electron beam on the light reception unit 110 in respective different periods. With such a configuration, each of the unit cells 100 can store information about a plurality of frames.

The plurality of memories 134 to 136 is connected to the output signal lines via connection switches 137 to 139, respectively. In FIG. 4, three output signal lines are illustrated as a single piece of wiring for the sake of simplicity. With such a configuration, information about a plurality of frames can be output to a signal processing circuit 13 in parallel.

Figure 5A:
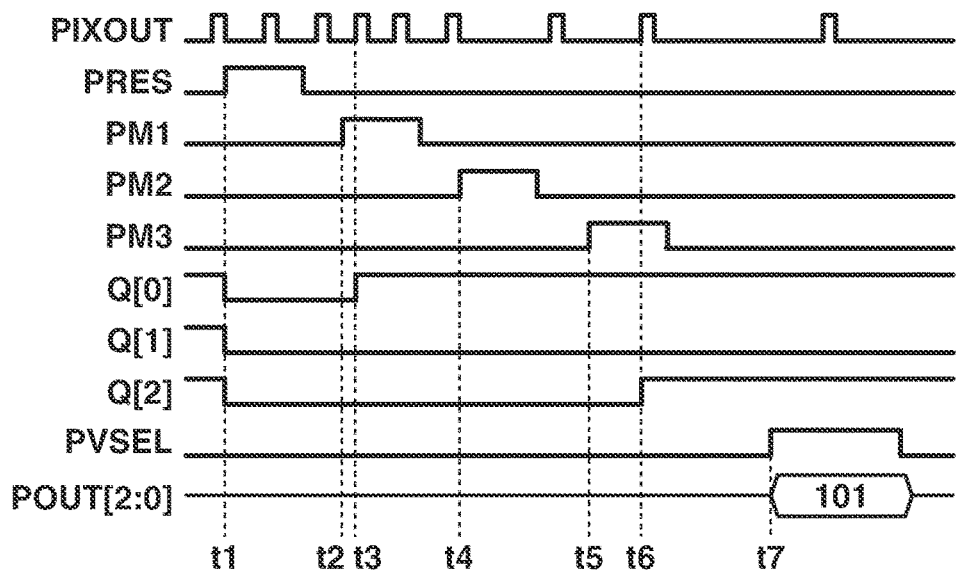
FIGS. 5A and 5B are timing charts each illustrating an operation of the electron beam detection element.
Figure 5B:
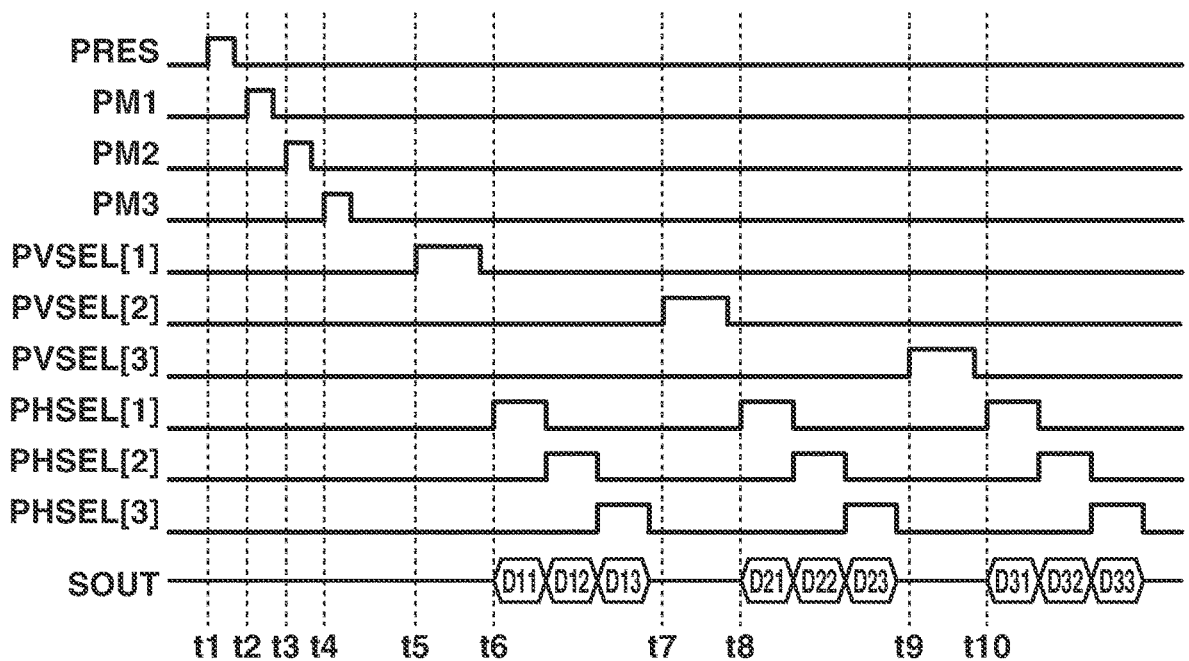

An operation of the electron beam detection element 10 will be described. FIGS. 5A and 5B are diagrams each schematically illustrating a timing chart of control signals and output signals for the electron beam detection element 10.

FIG. 5A is a diagram illustrating a signal storing operation of the unit cell 100. At time t1, the control signal PRES becomes a high level. Outputs Q[0] to Q[2] of the plurality of memories 134 to 136 are thereby set to "0". The control signals PM1 to PM3 then become a high level at times t2, t4, and t5, respectively. The control signals PM1 to PM3 become a low level after a lapse of a predetermined period.

FIG. 5A illustrates an output signal PIXOUT of the detection unit 120. If an electron beam is incident on the light reception unit 110, the potential of the cathode of the diode 111 drops. In response to the drop, the output signal PIXOUT of the detection unit 120 becomes a high level. The potential of the cathode of the diode 111 then rises because of the quenching element 112. In response to the rise, the output signal PIXOUT of the detection unit 120 returns to a low level.

At time t3, the output signal PIXOUT of the detection unit 120 becomes a high level. Time t3 is included in the period when the control signal PM1 is at a high level. In other words, the selection unit 131 selects the memory 134. The output Q[0] of the memory 134 thus becomes "1". In such a manner, the output Q[0] of the memory 134 indicates whether an electron beam is incident on the light reception unit 110 in the period when the memory 134 is selected. The same applies to the output Q[1] of the memory 135 and the output Q[2] of the memory 136.

In the example of FIG. 5A, an electron beam is incident on the light reception unit 110 in the period when the control signal PM1 is at a high level and in the period when the control signal PM3 is at a high level. In the period when the control signal PM2 is at a high level, no electron beam is incident on the light reception unit 110. More specifically, the outputs of the plurality of memories 134 to 136 are "101" in order. The unit cell 100 outputs the signals ("101") stored in the plurality of memories 134 to 136 in a period when the control signal PVSEL supplied from the vertical scanning circuit 12 is at a high level.

FIG. 5B is a diagram illustrating a signal output operation of the plurality of unit cells 100. FIG. 5B illustrates the control signals PHSEL[1] to PHSEL[3] supplied from the horizontal scanning circuit 14 and the output signal SOUT of the output circuit 15 in addition to signals illustrated in FIG. 5A.

The operations at times t1 to t5 are similar to those described in FIG. 5A. In the present exemplary embodiment, the unit cells 100 in the plurality of rows simultaneously store signals. At time t5, the control signal PVSEL[1] supplied to the unit cells 100 in the first row becomes a high level. The signals stored in the unit cells 100 in the first row are thereby output to the signal processing circuits 13 in parallel. At and after time t6, the horizontal scanning circuit 14 successively turns the control signals PHSEL[1] to PHSEL[3] to a high level. The signals stored in the plurality of signal processing circuits 13 are thereby read in succession.

At and after time t7, a similar read operation is performed on the unit cells 100 in the second row. At and after time t9, a similar read operation is performed on the unit cells 100 in the third row. By such operations, the signals can be read from the plurality of rows of the unit cells 100.

As illustrated in FIG. 5B, the signals from the plurality of unit cells 100 are output in order of data D11, data D12, . . ., data D32, and data D33. The correspondence between the unit cells 100 and the pieces of data D is similar to that described in the first exemplary embodiment.

The data D11 includes information about a plurality of frames in the unit cell 100 designated by the reference symbol P11. That is, information about a plurality of frames is output from each unit cell 100 in succession from the electron beam detection element 10. To organize such pieces of information frame by frame, a signal processing apparatus 1016 is connected to the electron beam detection element 10 according to the present exemplary embodiment.

Figure 6A:
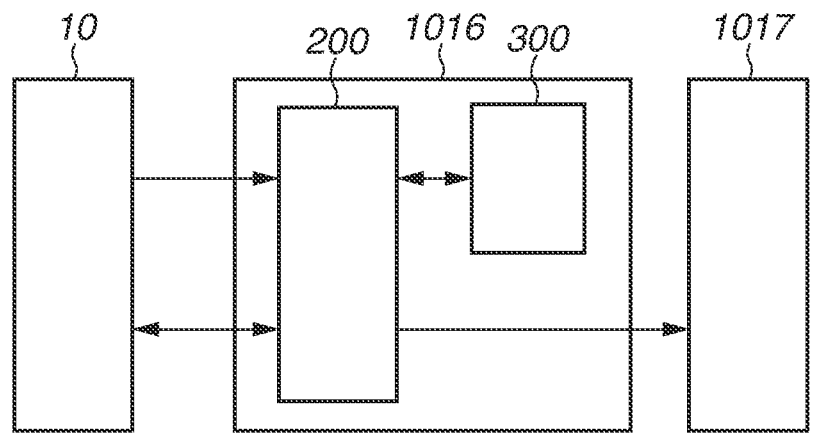
FIG. 6A is a block diagram schematically illustrating a configuration of an electron beam detection system.

FIG. 6A is a block diagram schematically illustrating a configuration of an electron beam detection system. The electron beam detection system includes the electron beam detection element 10, the signal processing apparatus 1016, and a monitor 1017. An example of the electron beam detection system is an electron microscope. The signal processing apparatus 1016 includes a signal processing unit 200 and a frame memory 300. The monitor 1017 displays an image based on the signals output from the plurality of unit cells 100.

Figure 6B:
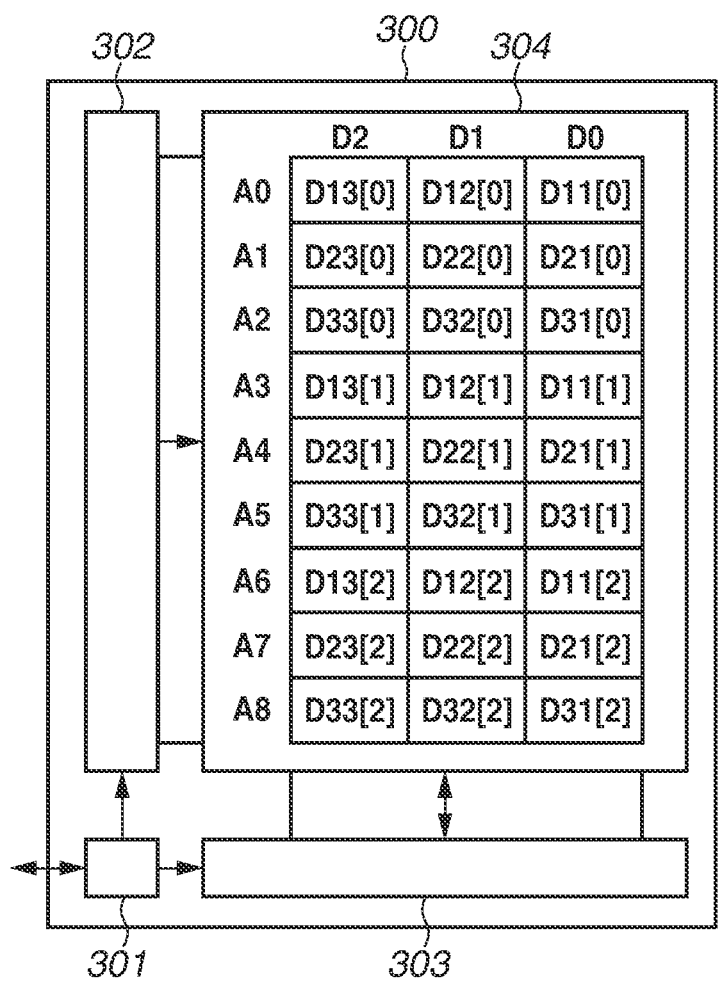
FIG. 6B is a diagram schematically illustrating a configuration of a frame memory.

FIG. 6B is a diagram schematically illustrating a configuration of the frame memory 300. An example of the frame memory 300 is a random access memory (RAM). The frame memory 300 includes an input/output control unit 301, a row decoder 302, a column decoder 303, and a RAM array 304. Data output from the electron beam detection element 10 is stored in a predetermined address of the RAM array 304 by control of the input/output control unit 301. The frame memory 300 outputs data stored in a predetermined address of the RAM array 304 by control of the input/output control unit 301.

As described above, the unit cell 100 designated by the reference symbol P11 outputs data D11 including information about three frames. In the example of FIG. 5B, the data D11 includes "101". The pieces of information about the three frames, D11[0] to D11[2], are stored in a RAM at address A0D0, a RAM at address A3D0, and a RAM at address A6D0, respectively. In such a manner, the RAM array 304 stores all the information about the three frames.

The data is then output frame by frame based on control of the input/output control unit 301. FIG. 7 is a diagram schematically illustrating image data output by the signal processing apparatus 1016.

As described above, the electron beam detection system according to the present exemplary embodiment includes the signal processing apparatus 1016. With such a configuration, appropriate signal processing can be performed to display an image on the monitor 1017 in a case where each of the single unit cells 100 collectively outputs information about a plurality of frames.

As described above, the electron beam detection element 10 includes the unit cells 100, each of which includes a plurality of memories. With such a configuration, each single unit cell 100 can store information about a plurality of frames. The electron beam detection element 10 can thus perform imaging of a plurality of frames without intervention during a period for reading signals. As a result, the imaging of a plurality of frames can be performed at a high speed.

In the present exemplary embodiment, the unit cells 100 each include the selection units 131 to 133. With such a configuration, some memories from among the plurality of memories can be activated by control. As a result, power consumption can be reduced.

Figure 8:
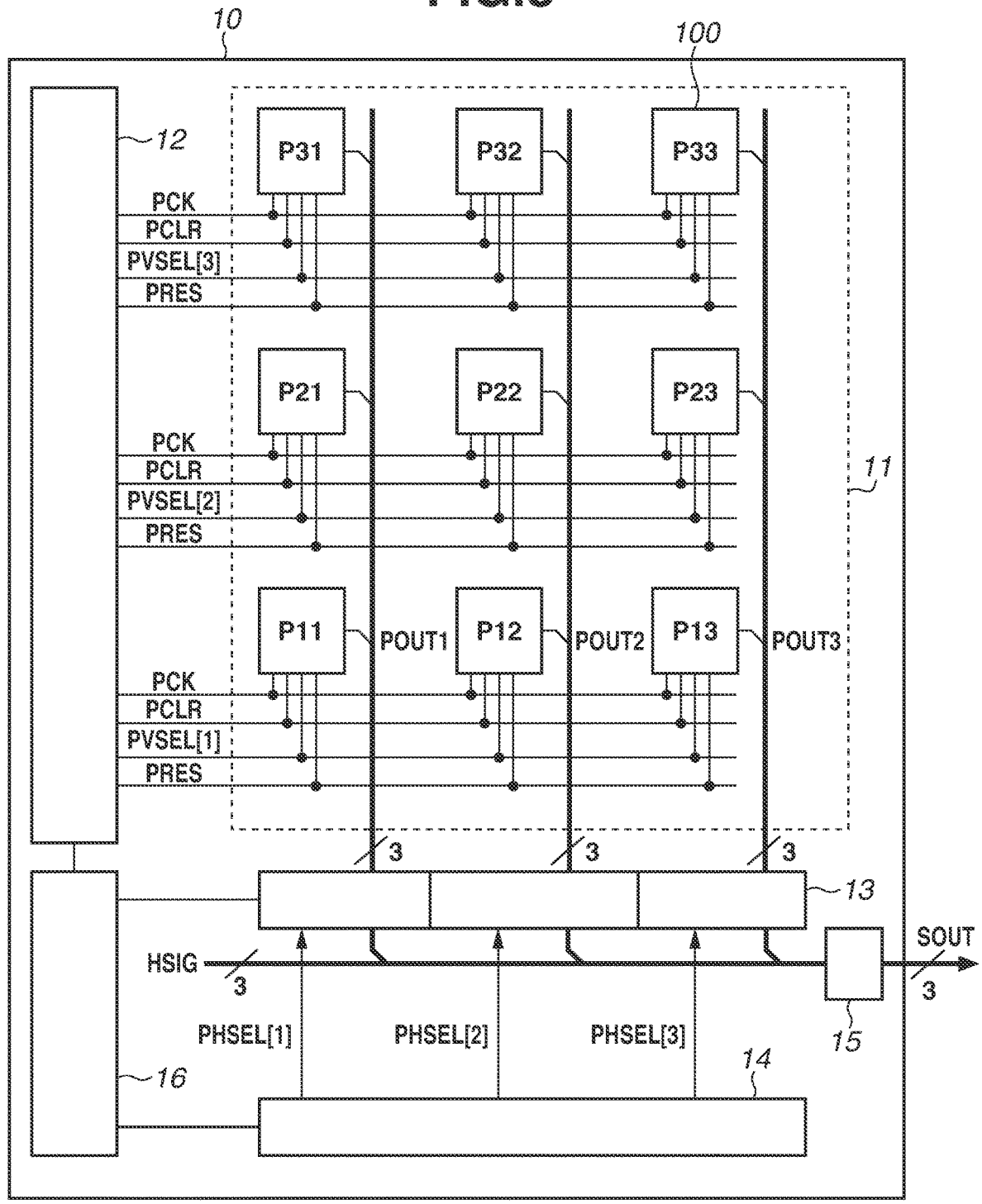
FIG. 8 is a diagram schematically illustrating a configuration of an electron beam detection element.

An electron beam detection element according to a third exemplary embodiment will be described. The present exemplary embodiment is different from the first and second exemplary embodiments in that the unit cells 100 each include a plurality of memories 141 to 143 serving as a shift register. FIG. 8 is a diagram schematically illustrating a configuration of the electron beam detection element. Portions having functions similar to those of FIGS. 1A and 1B or FIG. 3 are designated by the same reference numerals or symbols as in FIGS. 1A and 1B or FIG. 3.

An electron beam detection element 10 includes a plurality of unit cells 100. The unit cell 100 outputs a signal according to incidence of an electron beam. The plurality of unit cells 100 is arranged in a matrix form in an electron beam detection area 11.

The electron beam detection element 10 includes a vertical scanning circuit 12, signal processing circuits 13, and a horizontal scanning circuit 14. The vertical scanning circuit 12 drives the unit cells 100. The signal processing circuits 13 process signals output from the unit cells 100. The horizontal scanning circuit 14 is for reading signals from the signal processing circuits 13. The electron beam detection element 10 further includes an output circuit 15 which outputs the signals to outside, and a control circuit 16 which controls operation of the circuits 12 to 15.

A plurality of signal processing circuits 13 is provided in the electron beam detection element 10 and each of the signal processing circuits 13 corresponds to a different column formed by the plurality of unit cells 100. Each of the signal processing circuits 13 has a function of storing signals output from the unit cells 100. Unit cells 100 in a single column are connected with a plurality of output signal lines (in FIG. 8, three output signal lines). Each of the signal processing circuits 13 corresponding to a different column can thus store a plurality of signals output from the unit cells 100 in the corresponding column.

Figure 9:
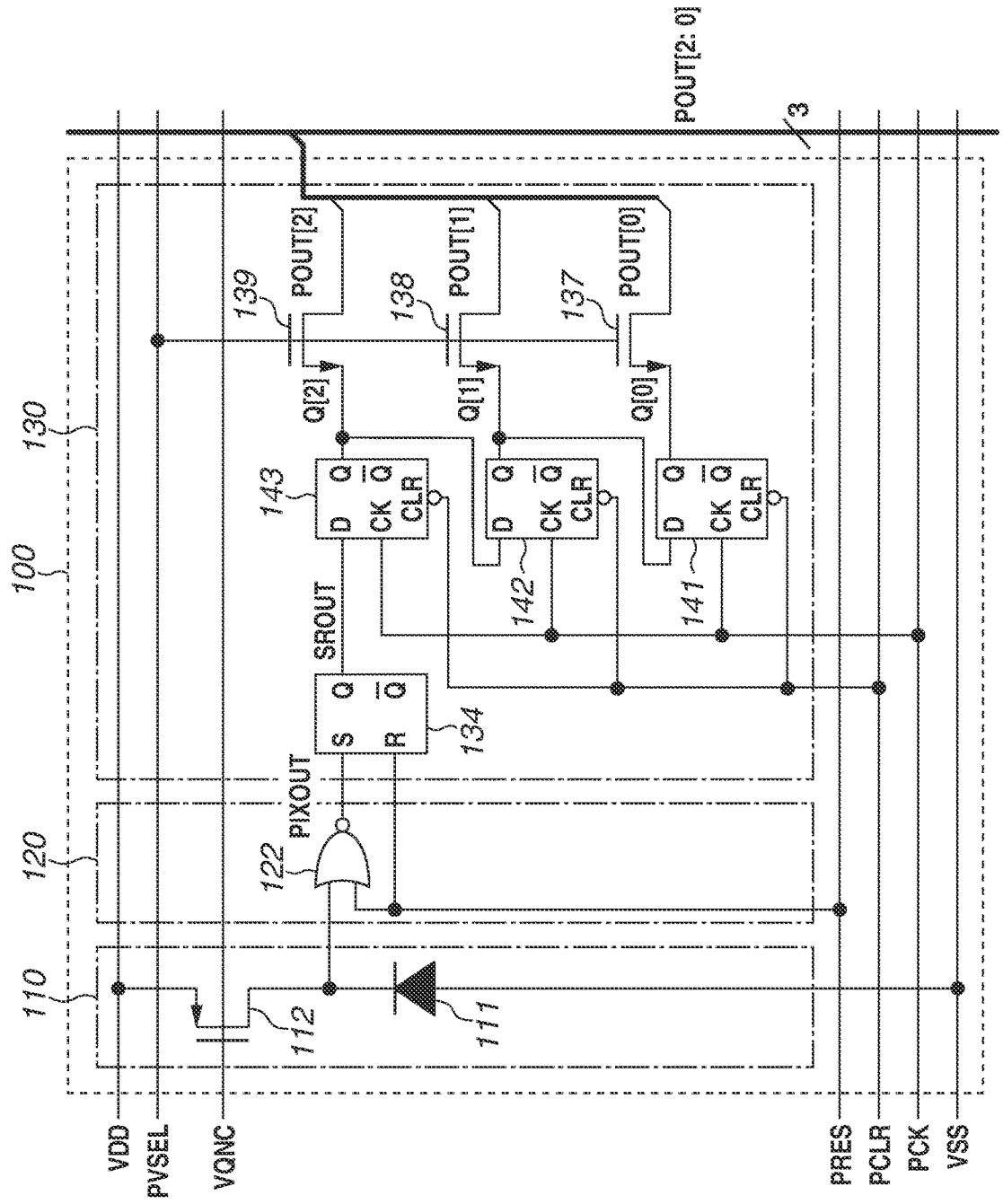
FIG. 9 is a diagram schematically illustrating a configuration of a unit cell of the electron beam detection element.

Next, a configuration of the unit cell 100 will be described. FIG. 9 is an equivalent circuit diagram schematically illustrating the configuration of the unit cell 100. The unit cell 100 includes a light reception unit 110, a detection unit 120, and a memory unit 130. The light reception unit 110 receives an electron beam. The detection unit 120 detects incidence of the electron beam on the light reception unit 110. The memory unit 130 stores a signal from the light reception unit 110.

The light reception unit 110 according to the present exemplary embodiment has a configuration similar to that of the light reception unit 110 according to the second exemplary embodiment. Because the description of the light reception unit 110 according to the present exemplary embodiment is similar to the description of the light reception unit 110 according to the second exemplary embodiment, a redundant description will be omitted.

Figure 10A:
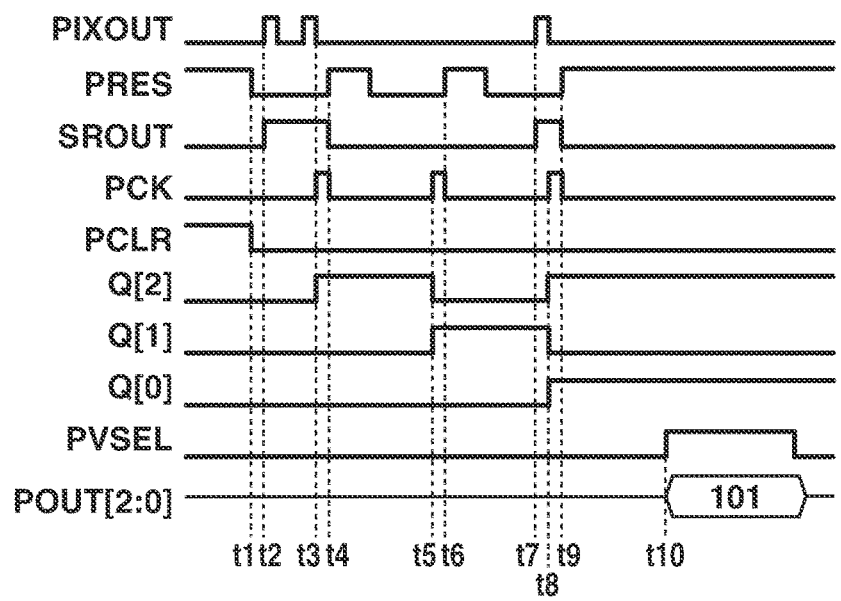
FIGS. 10A and 10B are timing charts each illustrating an operation of the electron beam detection element.
Figure 10B:
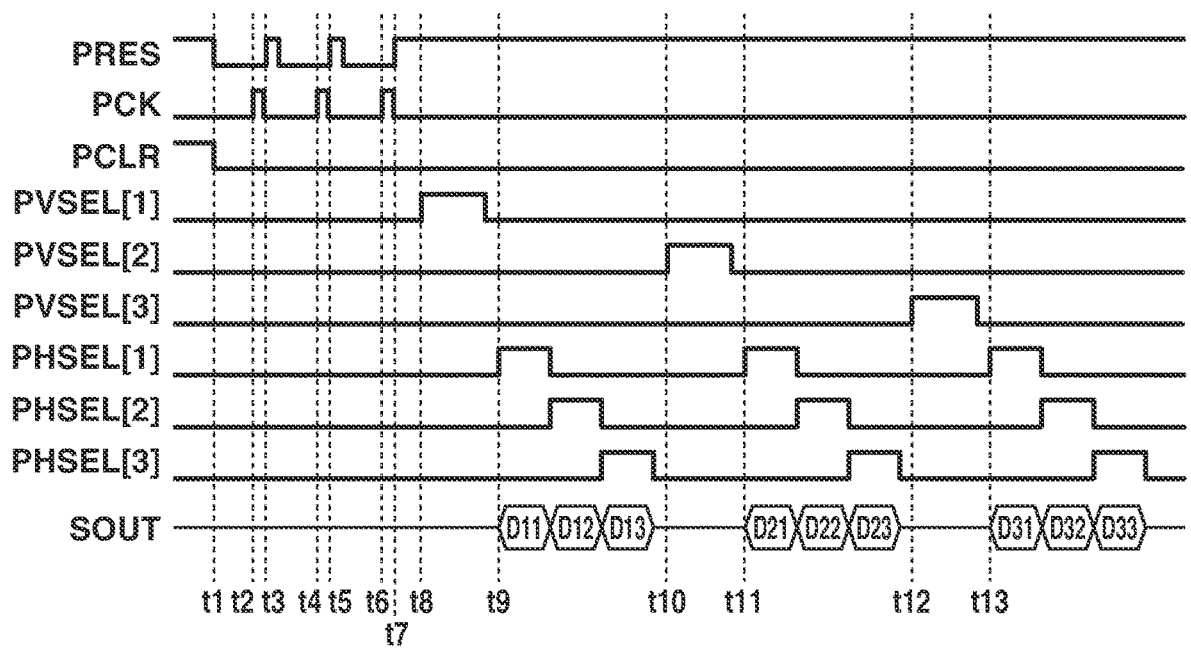

The detection unit 120 includes a logic gate circuit 122. The logic gate circuit 122 changes its output based on a change in the potential of the cathode of the diode 111 in either one of periods in which a control signal PRES is at a low level and in which the control signal PRES is at a high level. The output of the logic gate circuit 122 does not change in the other of the periods in which the control signal PRES is at a low level and in which the control signal PRES is at a high level. If the logic gate circuit 122 is a NAND circuit, the logic gate circuit 122 inverts and amplifies a change in the potential of the cathode of the diode 111 in the period when the control signal PRES is at a high level. In the period when the control signal PRES is at a low level, the output of the logic gate circuit 122 remains constant regardless of the potential of the cathode of the diode 111. If, as in FIG. 9, the logic gate circuit 122 is a NOR circuit, the logic gate circuit 122 inverts and amplifies a change in the potential of the cathode of the diode 111 in the period when the control signal PRES is at a low level. In the period when the control signal PRES is at a high level, the output of the logic gate circuit 122 remains constant regardless of the potential of the cathode of the diode 111. With such a configuration, the detection unit 120 can detect incidence of an electron beam on the light reception unit 110 with high sensitivity. FIGS. 10A and 10B, which are described below, illustrate an example in which the logic gate circuit 122 is a NOR circuit.

The memory unit 130 includes an input SR latch circuit 134 and a plurality of memories 141 to 143. Each memory stores an output signal of the detection unit 120. According to the present exemplary embodiment, each memory includes a D latch circuit. The plurality of memories 141 to 143 thus store one bit of information each.

The signal from the detection unit 120 is input to the input node S of the input SR latch circuit 134. The control signal PRES is input to the input node R of the input SR latch circuit 134. The output node Q of the input SR latch circuit 134 is connected to the input node D of the D latch circuit that serves as the memory 143. The output node Q of the D latch circuit that serves as the memory 143 is connected to the input node D of the D latch circuit that serves as the memory 142. The output node Q of the D latch circuit that serves as the memory 142 is connected to the input node D of the D latch circuit that constitutes the memory 141.

In such a manner, the plurality of memories 141 to 143 serve as a shift register. Data is then successively transferred to the input SR latch circuit 134, the memory 143, the memory 142, and the memory 141 in this order based on a control signal PCK. The data indicates whether an electron beam is incident on the light reception unit 110 in a predetermined period. The plurality of memories 141 to 143 thus store information about incidence of the electron beam on the light reception unit 110 in respective different periods. With such a configuration, each of the unit cells 100 can store information about a plurality of frames.

The output nodes Q of the plurality of memories 141 to 143 are connected to the output signal lines via connection switches 137 to 139, respectively. For example, the output node Q of the D latch circuit that serves as the memory 143 is connected to both a different memory (in this case, memory 142) in the unit cell 100 and the output signal line. In FIG. 9, the three output signal lines are illustrated as a single piece of wiring for the sake of simplicity. With such a configuration, information about a plurality of frames can be output to a signal processing circuit 13 in parallel.

Next, an operation of the electron beam detection element 10 will be described. FIGS. 10A and 10B are diagrams schematically illustrating timing charts of control signals and output signals used in the electron beam detection element 10.

FIG. 10A is a diagram for describing a signal storing operation of the unit cell 100. At time t1, a control signal PCLR becomes a low level. This shifts the plurality of memories 141 to 143 into a state for storing a signal. At time t1, the control signal PRES becomes a low level. If an electron beam is incident on the light reception unit 110 in a period when the control signal PRES is at a low level, an output signal PIXOUT of the logic gate circuit 122 becomes a high level. In FIG. 10A, an electron beam is incident on the light reception unit 110 at time t2. The operation of the light reception unit 110 when an electron beam is incident on the light reception unit 110 is similar to that of the second exemplary embodiment.

In response to the output signal PIXOUT being a high level at time t2, an output signal SROUT of the input SR latch circuit 134 is at a high level at and after time t2.

At time t3, the control signal PCK becomes a high level. This allows the memory 143 at the initial stage to store (latch) the output signal SROUT from the input SR latch circuit 134. Since the output signal SROUT is at a high level at time t3, the output signal Q[2] of the memory 143 is "1" (high level) at and after time t3. Both the output signals Q[1] and Q[0] are "0".

At time t4, the control signal PRES becomes a high level. This resets the output signal SROUT of the input SR latch circuit 134 to a low level.

The control signal PRES then becomes a low level again. In the period between times t4 and t5, there is no incident electron beam. The output signal SROUT of the input SR latch circuit 134 thus remains at the low level.

At time t5, the control signal PCK becomes a high level. This allows the memory 143 at the initial stage to store (latch) the output signal SROUT from the input SR latch circuit 134. Since the output signal SROUT is a low level at time t5, the output signal Q[2] of the memory 143 is "0" (low level) at and after time t5.

The memory 142 latches the output signal Q[2] of the memory 143 at the preceding stage. The output signal Q[1] of the memory 142 is thus "1" at and after time t5. At this point in time, the output signal Q[0] of the memory 141 is "0".

Similar operations are subsequently repeated. In the example of FIG. 10A, the output signal PIXOUT of the logic gate circuit 122 becomes a high level at time t7. The plurality of memories 141 to 143 thus eventually store data "101".

In a period when the control signal PVSEL supplied from the vertical scanning circuit 12 is at a high level (at and after time t10), the unit cell 100 outputs the signals ("101") stored in the plurality of memories 141 to 143.

FIG. 10B is a diagram for describing a signal output operation of the plurality of unit cells 100. FIG. 10B illustrates control signals PHSEL[1] to PHSEL[3] supplied from the horizontal scanning circuit 14 and the output signal SOUT of the output circuit 15 in addition to the signals illustrated in FIG. 10A.

The operations from times t1 to t9 are similar to those described in FIG. 10A. The operations at and after time t8 are similar to those at and after time t5 of FIG. 5B. Because the description of the present exemplary embodiment is similar to the description of the first exemplary embodiment, a redundant description will be omitted. Signals can be read from the plurality of rows of unit cells 100 by the foregoing operations.

As in the first exemplary embodiment, the electron beam detection element 10 according to the present exemplary embodiment is used in the electron beam detection system illustrated in FIGS. 6A and 6B. The electron beam detection system has a similar configuration to that of the first exemplary embodiment. Because the description of the present exemplary embodiment is similar to the description of the first exemplary embodiment, a redundant description will be omitted.

As described above, the electron beam detection element 10 includes the unit cells 100, each of which includes a plurality of memories. With such a configuration, each unit cell 100 can store information about a plurality of frames. The electron beam detection element 10 can thus perform imaging of a plurality of frames without intervention during a period for reading signals. As a result, the imaging of a plurality of frames can be performed at a high speed.

According to the present exemplary embodiment, the unit cell 100 includes a shift register. Such a configuration can reduce the number of control lines for controlling the unit cells 100.

Figure 11:
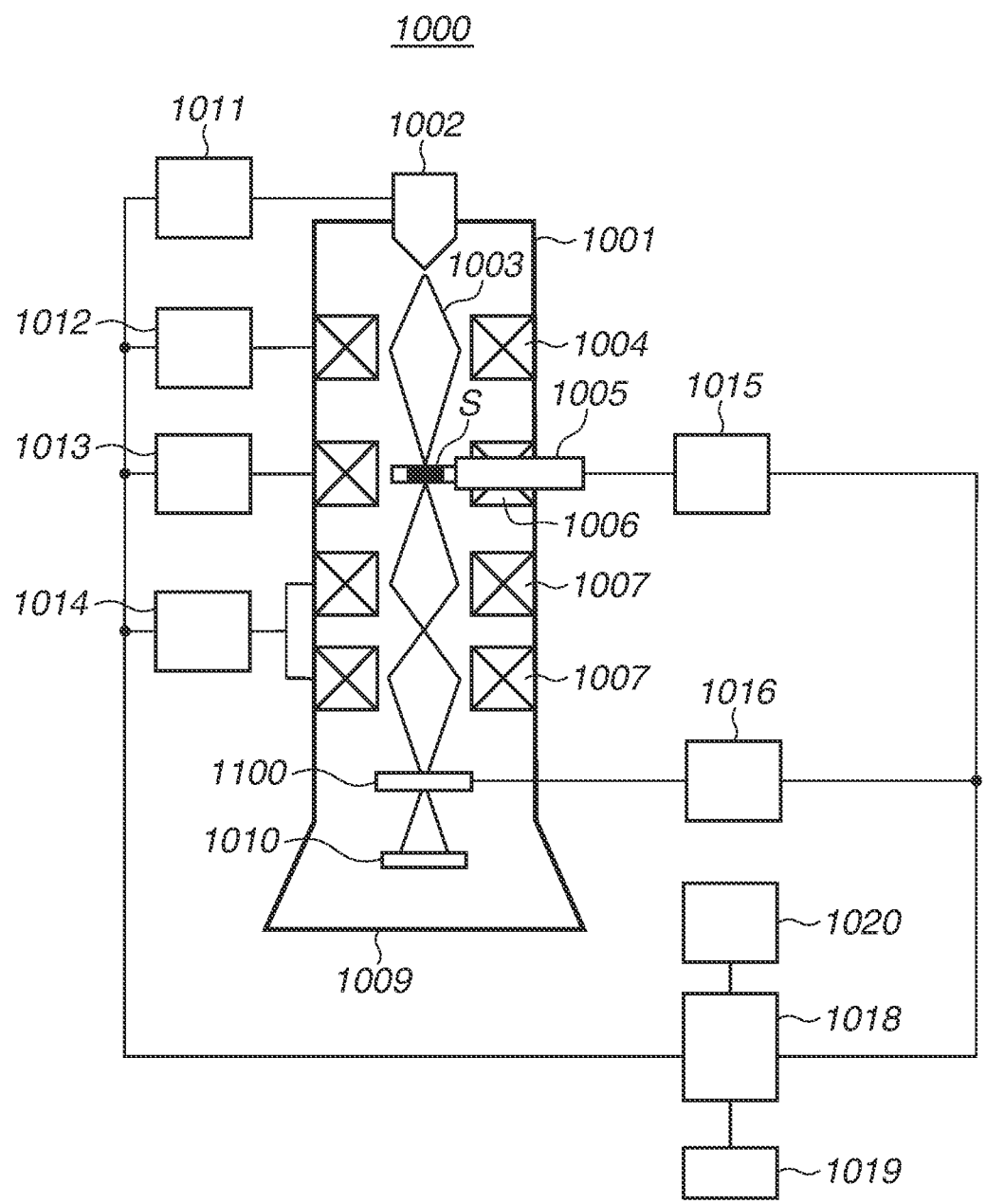
FIG. 11 is a block diagram of an exemplary embodiment of a transmission electron microscope.

A fourth exemplary embodiment will be described below. FIG. 11 is a schematic diagram illustrating a configuration of a transmission electron microscope, which is an example of an electron microscope. FIG. 11 is a schematic diagram illustrating the configuration of a transmission electron microscope including an electron beam detection element 1100. An electron beam 1003 emitted from an electron gun 1002 of an electron microscope main body 1000 is focused by an irradiation lens 1004 to irradiate a subject S held on a subject stage. The electron beam 1003 transmitted through the subject S is magnified by an objective lens 1006 and a magnification lens system 1007, and is projected on the electron beam detection element 1100. The electron optical system for irradiating the subject S with the electron beam will be referred to as an irradiation optical system. The electron optical system for forming an image of the electron beam transmitted through the subject S on the electron beam detection element 1100 will be referred to as an imaging optical system. A subject holding stage for maintaining the subject S in a low-temperature state may be provided on the subject stage so that the subject S can be measured in a cooled state.

The electron gun 1002 is controlled by an electron gun control apparatus 1011. The irradiation lens 1004 is controlled by an irradiation lens control apparatus 1012. The objective lens 1006 is controlled by an objective lens control apparatus 1013. The magnification lens system 1007 is controlled by a magnification lens system control apparatus 1014. A subject stage control mechanism 1005 is controlled by a subject stage driving mechanism control apparatus 1015.

The electron beam 1003 transmitted through the subject S is detected by the electron beam detection element 1100. Based on an output signal from the electron beam detection element 1100, a signal processing apparatus 1016 and an image processing apparatus 1018 generate an image signal. The generated image signal (transmission electron image) is used for display on an image display monitor 1020 and/or an analysis monitor.

A camera chamber 1009 is formed at the bottom of the electron microscope main body 1000. A fluorescent screen 1010 is arranged in the camera chamber 1009. If the electron beam detection element 1100 is retracted from the path of the electron beam 1003, a magnified image of the subject S formed by the electron beam 1003 can be observed on the fluorescent screen 1010.

The electron gun control apparatus 1011, the irradiation lens control apparatus 1012, the objective lens control apparatus 1013, the magnification lens system control apparatus 1014, and the subject stage driving mechanism control apparatus 1015 are connected to the image processing apparatus 1018 and to each other. Each of the electron gun control apparatus 1011, the irradiation lens control apparatus 1012, the objective lens control apparatus 1013, the magnification lens system control apparatus 1014, and the subject stage driving mechanism control apparatus 1015 mutually exchanges data with the image processing apparatus 1018. The image processing apparatus 1018 can thereby set imaging conditions of the electron microscope. Driving control of the subject stage can be performed and observation conditions of the lenses can be set by signals from the image processing apparatus 1018. The image processing apparatus 1018 is further connected to the electron beam detection element 1100 and controls an operation of the electron beam detection element 1100. More specifically, according to the present exemplary embodiment, the image processing apparatus 1018 is a control unit for controlling an operation of the electron beam detection element 1100.

An operator prepares the subject S to be imaged and sets imaging conditions using an input device 1019 that is connected to the image processing apparatus 1018. The operator inputs predetermined data for each of the electron gun control apparatus 1011, the irradiation lens control apparatus 1012, the objective lens control apparatus 1013, and the magnification lens system control apparatus 1014 so that an image is captured using a desired acceleration voltage, magnification, and observation mode. The operator also inputs conditions, for example, the number of sequential field images, an imaging start position, and a moving speed of the subject stage, into the image processing apparatus 1018 by using the input device 1019. The image processing apparatus 1018 can be configured to automatically set the conditions without operator inputs.

While the present disclosure has been described with reference to exemplary embodiments, it is to be understood that the claims are not limited to the disclosed exemplary embodiments. The scope of the following claims is to be accorded the broadest interpretation so as to encompass all such modifications and equivalent structures and functions.

This application claims priority to Japanese Patent Application No. 2017-214833, which was filed on Nov. 7, 2017 and which is hereby incorporated by reference herein in its entirety.

What is claimed is:

1. An electron beam detection element comprising:
   a plurality of unit cells,
   wherein each unit cell of the plurality of unit cells includes
      a diode of avalanche multiplication type configured to receive an electron beam,
      a detection unit configured to detect incidence of the electron beam on the diode,
      a plurality of memories configured to store signals of different frames respectively, each of the signals being output from the detection unit, the plurality of memories including a first memory and a second memory,
      a selection unit including a plurality of selectors, wherein the plurality of selectors includes a first selector and a second selector, the first selector being connected to an output node of the detection unit and the first memory, the second selector being connected to the output node of the detection unit and the second memory,
   a first memory unit, including the first selector and the first memory, and a second memory unit, including the second selector and the second memory, that are connected in parallel to the output node of the detection unit in common, and
   a plurality of connection switches that respectively connect the plurality of memories to an output line,
   wherein the first selector is electrically between the output node of the detection unit and the first memory, and
   wherein the second selector is electrically between the output node of the detection unit and the second memory.

2. The electron beam detection element according to claim 1, wherein the selection unit is configured to select a memory into which a signal output from the diode is stored.

3. The electron beam detection element according to claim 1, wherein the plurality of memories constitute a shift register.

4. The electron beam detection element according to claim 3, wherein an output node of one of the plurality of memories is connected to both another memory among the plurality of memories and an output signal line.

5. The electron beam detection element according to claim 1, wherein the detection unit includes an inverter circuit.

6. The electron beam detection element according to claim 1, wherein the detection unit includes a logic gate circuit.

7. The electron beam detection element according to claim 1,
   wherein the plurality of unit cells are arranged in a matrix form, and
   wherein the electron beam detection element further includes a plurality of output signal lines, each output signal line of the plurality of output signal lines being connected to a different memory among the plurality of memories.

8. The electron beam detection element according to claim 1, wherein each unit cell of the plurality of unit cells includes a quenching element connected to the diode.

9. An electron beam detection element comprising:
   a plurality of unit cells,
   wherein each unit cell of the plurality of unit cells includes
      a diode of avalanche multiplication type configured to receive an electron beam,
      a detection unit configured to detect incidence of the electron beam on the diode,
      a plurality of memories configured to store a signal output from the detection unit, the plurality of memories including a first memory and a second memory,
      a selection unit including a plurality of selectors, wherein the plurality of selectors includes a first selector and a second selector, the first selector being connected to an output node of the detection unit and the first memory, the second selector being connected to the output node of the detection unit and the second memory, and the selection unit being configured to select a memory into which the signal output from the diode is stored in respective different periods, a first memory unit, including the first selector and the first memory, and a second memory unit, including the second selector and the second memory, that are connected in parallel to the output node of the detection unit in common, and
a plurality of connection switches that respectively connect the plurality of memories to an output line,
wherein the first selector is electrically between the output node of the detection unit and the first memory, and
wherein the second selector is electrically between the output node of the detection unit and the second memory.

10. The electron beam detection element according to claim 9, wherein the plurality of memories is configured to store signals of frames different from each other.

11. An electron microscope comprising:
the electron beam detection element according to claim 1; and
an electron gun,
wherein the electron beam detection element is configured to receive a secondary electron from a subject.

12. The electron microscope according to claim 11, further comprising:
a subject stage where the electron beam is irradiated, wherein the subject stage is configured to cool the subject.

13. A transmission electron microscope comprising:
the electron beam detection element according to claim 1; and
an electron gun,
wherein the electron beam detection element is configured to receive an electron transmitted through a subject.

14. The transmission electron microscope according to claim 13, further comprising:
a subject stage where the electron beam is irradiated, wherein the subject stage is configured to cool the subject.

15. An electron beam detection element comprising:
a plurality of unit cells,
wherein each unit cell of the plurality of unit cells includes
a respective diode of avalanche multiplication type configured to receive an electron beam,
a respective detection unit configured to detect incidence of the electron beam on the diode, wherein the detection unit includes an output node,
a respective plurality of memories configured to store signals output from the detection unit,
a respective plurality of selectors, wherein each selector of the plurality of selectors has a respective connection, to the output node of the detection unit, that can receive the signals output from the detection unit, such that the output node is common to the plurality of selectors, wherein each selector of the plurality of selectors has a respective connection, to a respective memory of the plurality of memories, that can supply the signals output from the detection unit to the respective memory, and wherein each selector of the plurality of selectors can select to supply the signals output from the detection unit to the respective memory and can select not to supply the signals output from the detection unit to the respective memory, and
a respective plurality of connection switches, wherein each connection switch of the plurality of connection switches connects a respective memory of the plurality of memories to an output line.

16. The electron beam detection element of claim 1, wherein the first selector and the second selector are connected to only one output node of the detection unit.

17. The electron beam detection element of claim 9, wherein the first selector and the second selector are connected to only one output node of the detection unit.

18. The electron beam detection element of claim 1,
wherein a respective input node of the first selector is connected to the output node of the detection unit and a respective output node of the first selector is connected to a respective input node of the first memory,
wherein a respective input node of the second selector is connected to the output node of the detection unit and a respective output node of the second selector is connected to a respective input node the second memory, and
wherein the respective input node of the first selector and the respective input node of the second selector are connected in parallel to the output node of the detection unit in common.

19. The electron beam detection element of claim 1,
wherein the first selector can select to input a respective received signal to the first memory and can select to not input the respective received signal to the first memory, and
wherein the second selector can select to input a respective received signal to the second memory and can select to not input the respective received signal to the second memory.

20. The electron beam detection element of claim 1,
wherein the plurality of memories further includes a third memory,
wherein the plurality of selectors further includes a third selector, the third selector being connected to the output node of the detection unit and the third memory, and
wherein a third memory unit, including the third selector and the third memory, is also connected in parallel to the output node of the detection unit in common.

21. The electron beam detection element of claim 1,
wherein, for each unit cell of the plurality of unit cells, the first memory of the respective unit cell is closer to the second memory of the respective unit cell than to any of the plurality of memories of the other unit cells of the plurality of unit cells.

* * * * *